(12) United States Patent
Zhai et al.

(10) Patent No.: US 10,602,602 B2
(45) Date of Patent: Mar. 24, 2020

(54) HEAT SINK FOR PLUG-IN CARD, PLUG-IN CARD INCLUDING HEAT SINK, AND ASSOCIATED MANUFACTURING METHOD

(71) Applicant: EMC IP Holding Company LLC, Hopkinton, MA (US)

(72) Inventors: Haifang Zhai, Shanghai (CN); Hendry Xiaoping Wu, Shanghai (CN); David Dong, Shanghai (CN); Yujie Zhou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/381,620

(22) Filed: Apr. 11, 2019

(65) Prior Publication Data

US 2019/0335575 A1 Oct. 31, 2019

(30) Foreign Application Priority Data

Apr. 28, 2018 (CN) .......................... 2018 1 0399388

(51) Int. Cl.
*H05K 1/02* (2006.01)
*H05K 7/20* (2006.01)
*F28F 13/00* (2006.01)

(52) U.S. Cl.
CPC ........... *H05K 1/0201* (2013.01); *F28F 13/00* (2013.01); *H05K 7/2039* (2013.01); *H05K 7/2049* (2013.01); *F28F 2215/12* (2013.01)

(58) Field of Classification Search
CPC ...... H05K 7/2039; H05K 7/2049; F28F 13/00
See application file for complete search history.

(56) References Cited

U.S. PATENT DOCUMENTS

| | | | | | |
|---|---|---|---|---|---|
| 4,770,242 A | * | 9/1988 | Daikoku | ............. | H01L 23/4338 165/185 |
| 5,345,107 A | * | 9/1994 | Daikoku | ................. | F28F 13/00 165/185 |
| 5,515,912 A | * | 5/1996 | Daikoku | ............. | H01L 23/4338 165/185 |
| 6,205,023 B1 | * | 3/2001 | Moribe | .............. | H05K 7/20436 165/185 |
| 6,496,369 B2 | * | 12/2002 | Nakamura | ............ | G06F 1/1616 165/80.3 |
| 6,604,575 B1 | * | 8/2003 | Degtiarenko | ........... | F28F 1/124 165/185 |
| 6,665,184 B2 | * | 12/2003 | Akselband | ................ | F28F 3/12 165/104.33 |
| 6,906,922 B2 | * | 6/2005 | Yu | ...................... | H05K 7/20154 165/121 |

(Continued)

*Primary Examiner* — Robert J Hoffberg
(74) *Attorney, Agent, or Firm* — Ryan, Mason & Lewis, LLP

(57) ABSTRACT

Various embodiments of the present disclosure provide a heat sink for a plug-in card and a plug-in card including the heat sink. The heat sink comprises a first part secured to a surface of the plug-in card and a second part coupled to the first part and being movable relative to the first part in a first direction, wherein the first direction is perpendicular to the surface of the plug-in card. In this way, when the second part and the first part have a larger overlap in the first direction, the heat sink has a smaller first height and when the second part and the first part have a smaller overlap in the first direction, the heat sink has a greater second height.

14 Claims, 5 Drawing Sheets

(56) References Cited

U.S. PATENT DOCUMENTS

| | | | | |
|---|---|---|---|---|
| 7,133,285 B2 * | 11/2006 | Nishimura | ............ | H05K 5/0265 |
| | | | | 361/715 |
| 8,570,744 B2 * | 10/2013 | Rau | ............................ | G06F 1/20 |
| | | | | 361/679.52 |
| 8,767,403 B2 * | 7/2014 | Rau | ............................ | G06F 1/20 |
| | | | | 361/721 |
| 9,791,501 B2 * | 10/2017 | Diglio | ................. | G01R 31/2863 |
| 2012/0293952 A1 * | 11/2012 | Herring | ................. | H01L 23/367 |
| | | | | 361/679.54 |

* cited by examiner

HEAT SINK FOR PLUG-IN CARD, PLUG-IN CARD INCLUDING HEAT SINK, AND ASSOCIATED MANUFACTURING METHOD

RELATED APPLICATION(S)

The present application claims priority to Chinese Patent Application No. 201810399388.5, filed Apr. 28, 2018, and entitled "Heat Sink for Plug-In Card, Plug-In Card Including Heat Sink, and Associated Manufacturing Method," which is incorporated by reference herein in its entirety.

FIELD

Various embodiments of the present disclosure generally relate to the storage field, and more specifically, to a heat sink for a plug-in card, a plug-in card including the heat sink and an associated manufacturing method.

BACKGROUND

At present, plug-in cards that have been widely used in storage devices, such as Input/Output (I/O) cards, are usually equipped with heat sinks for cooling the plug-in cards. In some conditions, a larger heat sink may be needed to provide better heat dissipation performance so as to ensure normal operation of the plug-in card. However, a larger heat sink may have a greater thickness, while the chassis panel usually has openings with limited opening height. Therefore, the heat sink with greater thickness may create obstacles during the hot plug operation of the plug-in card.

SUMMARY

In a first aspect, a heat sink for a plug-in card is provided. The heat sink comprises a first part secured to a surface of the plug-in card and a second part coupled to the first part and being movable relative to the first part in a first direction perpendicular to the surface of the plug-in card, such that the heat sink has different heights with different overlaps between the first part and the second part. In this way, when the second part and the first part have a larger overlap in the first direction, the heat sink has a smaller first height, and when the second part and the first part have a smaller overlap in the first direction, the heat sink has a greater second height.

In some embodiments, the first part may have a first heat radiating fin extending along the first direction, and the second part may have a second heat radiating fin corresponding to the first heat radiating fin and extending along the first direction, wherein the first heat radiating fin and the second heat radiating fin are staggered in the first direction and are in a thermal contact, and there is an offset between the first heat radiating fin and the second heat radiating fin in a second direction perpendicular to the first direction; or the first radiating heat fin and the second heat radiating fin are aligned in the first direction, and at least a portion of the second heat radiating fin can be received in the first heat radiating fin and is in thermal contact with the first heat radiating fin.

In some embodiments, the heat sink may also comprise a first transmission mechanism pivotably coupled to a side wall of the plug-in card via a shaft oriented along a second direction, wherein the side wall extends along a third direction perpendicular to the first direction and the second direction, and wherein the first transmission mechanism includes a first end coupled to the shaft and a second end coupled to the second part of the heat sink.

In some embodiments, the first transmission mechanism is configured as a U-shaped component including two first ends and two second ends, wherein a bottom part of the U-shaped component couples the two second ends in the second direction across the second part of the heat sink, and an arm of the U-shaped component couples one of the two first ends to a corresponding one of the two second ends.

In some embodiments, the heat sink further may comprise a second transmission mechanism extending along the third direction and coupled to the first transmission mechanism, wherein the second transmission mechanism is adapted for causing the first transmission mechanism to apply a force having a component along the first direction on the second part, in response to a movement of the second transmission mechanism along the third direction.

In some embodiments, the heat sink may further comprise a first torsion spring rotatably coupled to the side wall via the shaft defined by the second direction, and the second transmission mechanism comprises a first protrusion protruding in the second direction, wherein an end of the first torsion spring is coupled to the first protrusion and a further end of the first torsion spring is coupled to the first end of the first transmission mechanism.

In some embodiments, the heat sink may further comprise a second torsion spring rotatably coupled to a bottom of the plug-in card via a shaft defined by the first direction and a pressing part operable to receive a press operation along the second direction. The pressing part includes a second protrusion protruding in the second direction, wherein the second transmission mechanism further includes a recess oriented along the first direction, wherein an end of the second torsion spring is coupled to the second protrusion, and a further end of the second torsion spring is coupled to the recess of the second transmission mechanism.

In a second aspect, a plug-in card is provided. The plug-in card comprises the heat sink according to the first aspect of the present disclosure.

In a third aspect, a method for manufacturing the heat sink according to the first aspect of the present disclosure is provided.

It should be appreciated that the Summary is not intended to identify key or essential features of the embodiments of the present disclosure, or limit the scope of the present disclosure. Other features of the present disclosure will be understood more easily through the following description.

BRIEF DESCRIPTION OF THE DRAWINGS

Through the detailed description of the example embodiments in the drawings, the features and advantages of the present disclosure will become easy to understand. In the drawings.

In all drawings, the same or similar reference number indicates the same or similar element.

DETAILED DESCRIPTION

Principles of the present disclosure are now described with reference to some example embodiments. It can be appreciated that description of those embodiments is merely to assist those skilled in the art to understand and implement the present disclosure and does not suggest any restrictions over the scope of the present disclosure. The contents disclosed here can be implemented in various methods apart from the following described ones.

As used herein, the term "includes" and its variants are to be read as open-ended terms that mean "includes, but is not limited to." The term "based on" is to be read as "based at least in part on." The term "an embodiment" is to be read as "at least one embodiment." The term "a further embodiment" is to be read as "at least a further embodiment."

As described above, most of the plug-in cards currently known or already in use, such as an Input/Output (I/O) card, are provided with heat sinks. However, on one hand, a larger heat sink might be needed to ensure normal operation of the plug-in card in some conditions (e.g., in an ambient temperature of up to 77° C.). However, a larger heat sink probably means a greater thickness. On the other hand, an opening that is opened on a chassis panel usually has a limited height due to the requirement for high density of I/Os in the storage system, which might cause obstacles when inserting a plug-in card of a heat sink with a greater height into the chassis.

Embodiments of the present disclosure provide a height adjustable heat sink for a plug-in card. When the plug-in card is being inserted into or pulled out from the chassis opening, the height of the heat sink described according to various embodiments of the present disclosure can be conveniently adjusted, which causes no obstacles for the hot plug operations of the plug-in card, and meanwhile enhances heat dissipation capability of the plug-in card.

The plug-in card described in the context, for example, can be an Open Compute Project (OCP) card, small I/O card and the like. For ease of discussion, height/thickness direction of the plug-in card is referred to as a first direction Z, width direction of the plug-in card is referred to as a second direction X, and length direction of the plug-in card is referred to as a third direction Y in the context. The first direction Z, the second direction X and the third direction Y are substantially perpendicular to one another.

Figure 1:
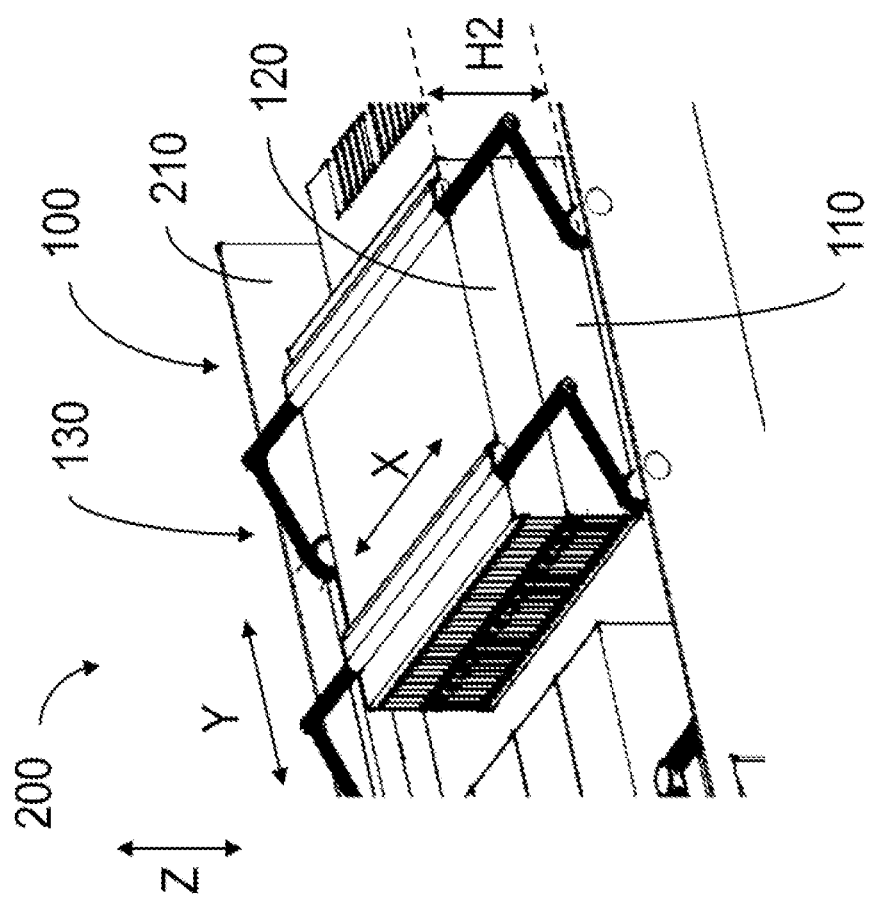
FIG. 1 illustrates a perspective view of a heat sink with a greater height according to an embodiment of the present disclosure.
Figure 2:
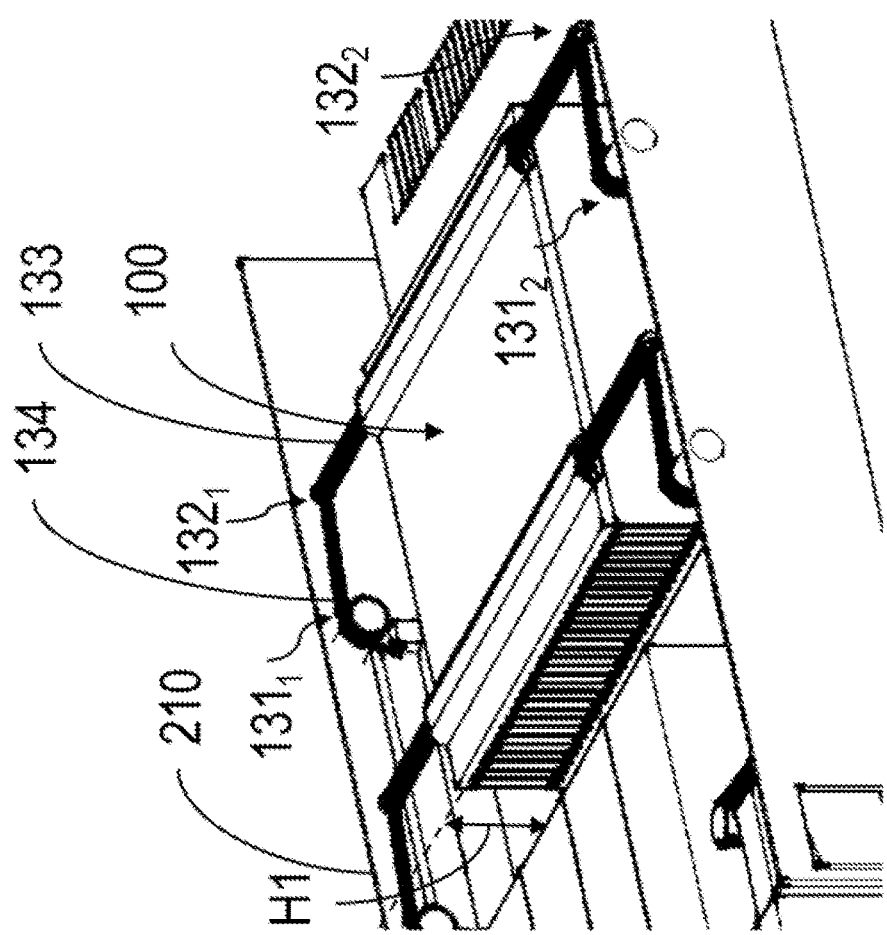
FIG. 2 illustrates a perspective view of a heat sink with a smaller height according to an embodiment of the present disclosure.

FIG. 1 and FIG. 2 respectively illustrate perspective views of a heat sink in two different states according to an embodiment of the present disclosure. FIG. 1 shows a heat sink with a greater height, while FIG. 2 demonstrates a heat sink with a smaller height.

As shown in FIG. 1, the heat sink 100 includes a first part 110 and a second part 120. The first part 110 is secured to a surface XY of the plug-in card 200 (or a plane where the plug-in card 200 is located), and the second part 120 is coupled to the first part 110 and movable relative to the first part 110 in the first direction Z. The first direction Z is perpendicular to the surface XY of the plug-in card 200.

By means of the relative movement in the first direction Z (i.e., in the height direction), the heat sink 100 can have a smaller, first height H1 when the second part 120 and the first part 110 have a larger overlap in the first direction Z (See, FIG. 2). Besides, when the second part 120 and the first part 110 have a smaller overlap in the first direction Z (See, FIG. 1), the heat sink 100 has a greater, second height H2.

In this way, a height-adjustable or telescopic/extendable heat sink 100 is implemented. As such, when the plug-in card 200 is being inserted into or being pulled out of the chassis opening, the heat sink 100 can be first adjusted to have a smaller height H1, such that the plug-in card 200 can be smoothly inserted or pulled out without hindrance. Then, the heat sink can be adjusted to a greater height H2 to improve its heat dissipation performance.

Figure 4:
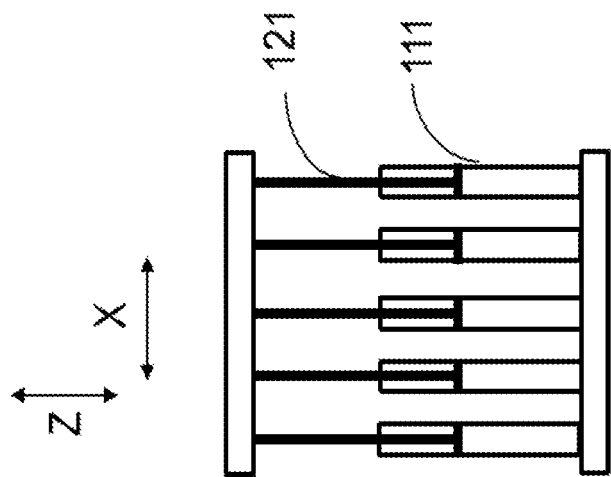
FIG. 4 illustrates a schematic diagram of a heat sink according to another embodiment of the present disclosure.
Figure 3:
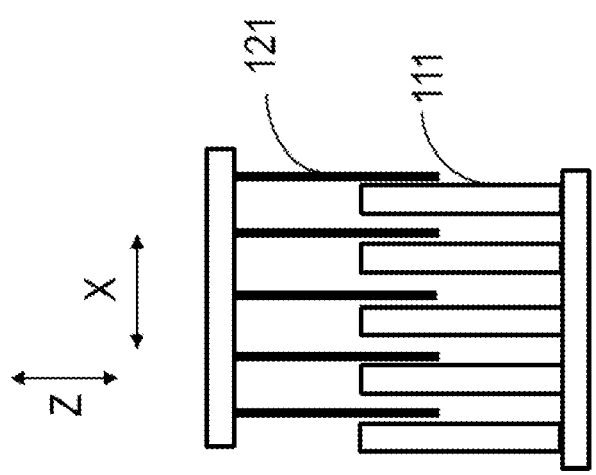
FIG. 3 illustrates a schematic diagram of a heat sink according to an embodiment of the present disclosure.

In some embodiments as shown in FIGS. 3 and 4, the first part 110 may have a first heat radiating fin 111 extending along the first direction Z, and the second part 120 may have a second heat radiating fin 121 corresponding to the first heat radiating fin 111 and extending along the first direction Z. Furthermore, the relative arrangement of the first heat radiating fin 111 to the second heat radiating fin 121 may also vary depending on various requirements or applications.

For example, in some embodiments as shown in FIG. 3, the first heat radiating fin 111 and the second heat radiating fin 121 can be staggered in the first direction Z, but maintaining thermal contact with each other, and there is an offset between the first heat radiating fin 111 and the second heat radiating fin 121 along the second direction X perpendicular to the first direction Z.

For another example, in some further embodiments as shown in FIG. 4, the first heat radiating fin 111 and the second heat radiating fin 121 can be aligned with each other in the first direction Z. At least a portion of the second heat radiating fin 121 can be received in the first heat radiating fin 111 and be in thermal contact with the first heat radiating fin 111. In other words, in this alternative embodiment, the second heat radiating fin 121 can either protrude from the first heat radiating fin 111 or retract within the first heat radiating fin 111 in order to achieve height adjustment.

The adjustment in heat dissipation performance as described above is based on the following recognition, that is, when the spacing between adjacent heat radiating fins remains constant, a larger area of the radiating fin can provide better heat dissipation performance because the contact area between the radiating fin and the surrounding cooling medium (such as air) is larger. Also, it is to be appreciated that the heat dissipation performance of the radiating fin can be further improved by additionally optimizing other factors, such as material and shape of the heat radiating fin.

Figure 5:
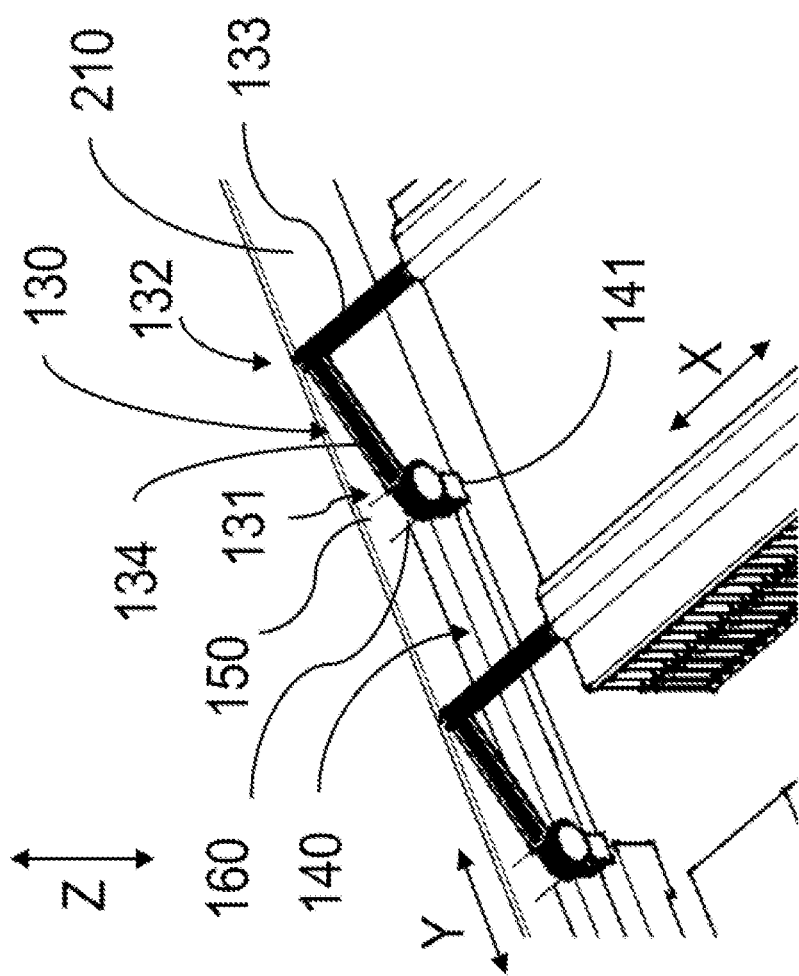
FIG. 5 illustrates a partial view of a heat sink according to an embodiment of the present disclosure.

FIG. 5 illustrates a partial view of the heat sink 100 according to an embodiment of the present disclosure. As shown in FIG. 5, in some embodiments, the heat sink 100 may also include a first transmission mechanism 130, which can be pivotably coupled to a side wall 210 of the plug-in card 200 via a shaft 150 oriented along the second direction X. As shown in FIG. 5, the side wall 210 extends along the third direction Y perpendicular to both the first direction Z and the second direction X. As further illustrated in FIG. 5, the first transmission mechanism 130 may include a first end 131 coupled to the shaft 150 and a second end 132 coupled to the second part 120 of the heat sink 100.

By means of the first transmission mechanism 130, the rotation of the first transmission mechanism 130 can be transformed into a force having a component along the first direction Z and applied onto the second part 120. Accordingly, height adjustment of the heat sink 100 can be implemented by a simple and direct force transmission manner.

In some embodiments, the first transmission mechanism 130 can be configured as a U-shaped component shown in FIG. 2. The U-shaped component includes two first ends $131_1$ and $131_2$ and two second ends $132_1$ and $132_2$. A bottom part 133 of the U-shaped component couples the two second ends $132_1$ and $132_2$ in the second direction X across the second part 120 of the heat sink 100. In other words, the bottom part 133 of the U-shaped component can be regarded as the extension of the two second ends $132_1$ and $132_2$ in the second direction X. In addition, an arm 134 of the U-shaped component also couples one of the two first ends $131_1$ and $131_2$ to a corresponding one of the two second ends $132_1$ and $132_2$.

Such U-shaped implementation not only provides a bottom part 133 extending in the entire width direction, but also provides two symmetrically arranged arms 134 for the first transmission mechanism 130. Therefore, a uniform distribution of the force in the width direction can be provided, which facilitates the manipulation to the second part 120 of the heat sink 100.

Alternatively, or in addition, a plurality of such transmission mechanisms 130 can be uniformly arranged along the third direction Y For example, as shown in FIG. 2, a plurality of U-shaped components are arranged along the length direction to further implement uniform distribution of the force in the length direction. It is to be noted that the present disclosure does not seek to limit the amount or the distribution of the first transmission mechanism 130. Although the embodiment of FIG. 2 illustrates two U-shaped components, it is to be understood that more than two U-shaped components can be arranged depending on the requirements. Of course, a single U-shaped component also can achieve manipulation to the second part 120. It is also to be understood that the plurality of transmission mechanisms 130 can also be non-uniformly arranged in the length direction.

Continuing to refer to FIG. 5, the heat sink 100 may also include a second transmission mechanism 140, which extends along the third direction Y and is coupled to the first transmission mechanism 130. The second transmission mechanism 140 is adapted for enabling the first transmission mechanism 130 to apply a force having a component along the first direction Z onto the second part 120 in response to the movement of the second transmission mechanism 140 along the third direction Y.

By means of the second transmission mechanism 140, the translation of the second transmission mechanism 140 is transformed into the rotation of the first transmission mechanism 130, and the rotation of the first transmission mechanism 130 is further transformed into the movement of the second part 120 in the vertical direction. The second transmission mechanism 140, which can be operated in the translational movement, is more beneficial for the users to manipulate the heat sink 100.

Still referring to FIG. 5, in some embodiments, the heat sink 100 may also include a first torsion spring 160, which can be rotatably coupled to the side wall 210 via the shaft 150 defined by the second direction X. Correspondingly, the second transmission mechanism 140 may include a first protrusion 141 protruding in the second direction X. According to FIG. 5, one end of the first spring torsion 160 is coupled to the first protrusion 141 and the other end of the first torsion spring 160 is coupled to the first end 131 of the first transmission mechanism 130.

By means of the fit of the first torsion spring 160 with the first protrusion 141 of the second transmission mechanism 140 and with the first end 131 of the first transmission mechanism 130, the force transmission between the first transmission mechanism 130 and the second transmission mechanism 140 can be implemented under a simple and compact construction.

Figure 6:
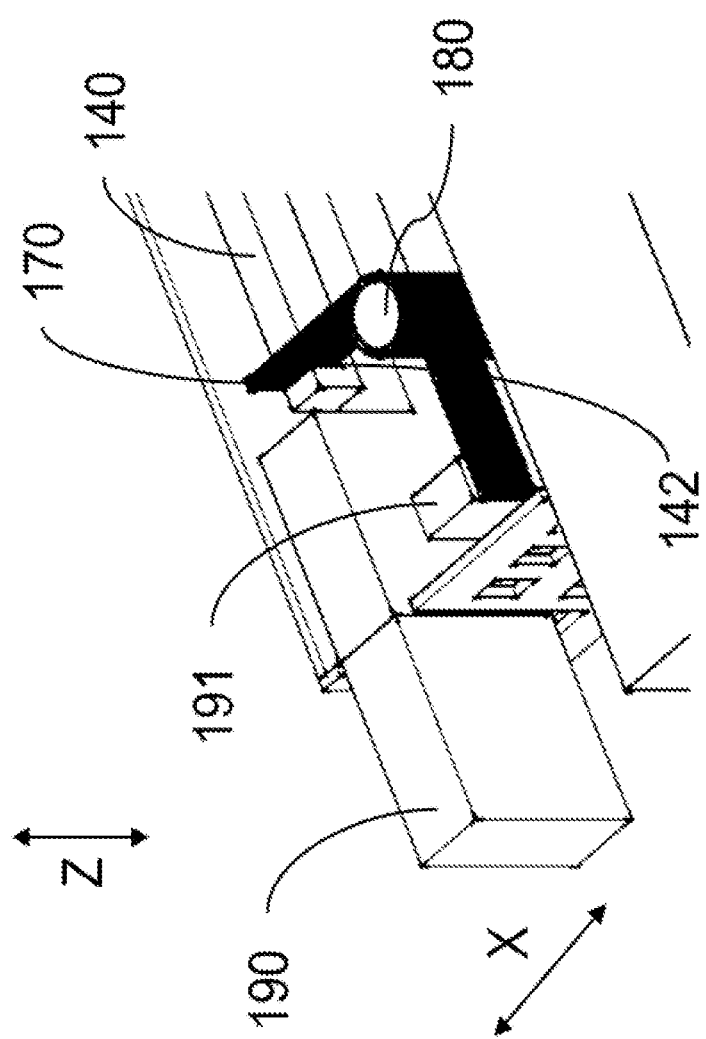
FIG. 6 illustrates a further partial view of a heat sink according to an embodiment of the present disclosure.

FIG. 6 illustrates a further partial view of the heat sink according to an embodiment of the present disclosure. As shown in FIG. 6, in some embodiments, the heat sink 100 may also include a second torsion spring 170, which can be rotatably coupled to the bottom of the plug-in card 200 via a shaft 180 defined by the first direction Z. Besides, the heat sink 100 may also include a pressing part 190, which can be operated to receive a press operation along the second direction X. In the example as shown in FIG. 6, the pressing part 190 includes a second protrusion 191 protruding in the second direction X, and the second transmission mechanism 140 further includes a recess 142 oriented along the first direction Z. As shown in FIG. 6, one end of the second torsion spring 170 is coupled to the second protrusion 191 and the other end of the second torsion spring 170 is coupled to the recess 142 of the second transmission mechanism 140.

By means of the fit of the second torsion spring 170 with the second protrusion 191 and the recess 142, force transmission or force interaction between the user and the second transmission mechanism 140 can also be implemented under a simple and compact construction. Besides, particularly by means of the pressing part 190 configured in such manner, the manipulation to the second part 120 of the heat sink 100 by the user can be further simplified. This is because the users can easily implement manipulation to the second part 120 of the heat sink 100 by simply performing a simple pinch operation in the horizontal direction. For example, when inserting/pulling the plug-in card 200 into/out from the chassis opening, the pressing part 190 can be conveniently pinched so as to first adjust the heat sink 100 to a smaller height H1. After the plug-in card is completely inside or outside the chassis, the pressing part 190 then can be released to adjust the heat sink back to the greater height H2.

Generally, although details of several implementations have been included in the above discussion, they should not be interpreted as any restrictions over the scope of the present disclosure. Instead, the details are descriptions of the features for the specific embodiments only. Certain features described in some separate embodiments also can be executed in combinations in a single embodiment. On the contrary, various features described in a single embodiment also can be implemented separately in multiple embodiments or in any suitable sub-combinations.

Although the present disclosure is described with specific structural features, it can be appreciated that the scope of the technical solution defined in the attached claims is not necessarily restricted to the above specific features. That is, the contents described above are optional embodiments of the present disclosure only. For those skilled in the art, embodiments of the present disclosure can have various modifications and changes. Any amendments, equivalent substitutions, improvements and the like are included in the protection scope of the present disclosure as long as they are within the spirit and principles of the present disclosure.

What is claimed is:

1. A heat sink for a plug-in card, comprising:
   a first part secured to a surface of the plug-in card, the first part having a first heat radiating fin extending along a first direction, the first direction being perpendicular to the surface of the plug-in card;
   a second part coupled to the first part and being movable relative to the first part in the first direction such that the heat sink has different heights with different overlaps between the first part and the second part, the second part having a second heat radiating fin corresponding to the first heat radiating fin and extending along the first direction; and a first transmission mechanism pivotably coupled to a side wall of the plug-in card via a shaft oriented along a second direction perpendicular to the first direction, wherein the side wall extends along a third direction perpendicular to the first direction and the second direction, the first transmission mechanism comprising a first end coupled to the shaft and a second end coupled to the second part of the heat sink, wherein one of:
the first heat radiating fin and the second heat radiating fin are arranged in a staggered manner in the first direction and are in a thermal contact with each other, and have an offset in between in the second direction; or the first heat radiating fin and the second heat radiating fin are aligned with each other in the first direction, and at least a portion of the second heat radiating fin is receivable in the first heat radiating fin and is in thermal contact with the first heat radiating fin.

2. The heat sink of claim 1, wherein the first transmission mechanism is configured as a U-shaped component comprising two first ends and two second ends; wherein a bottom part of the U-shaped component couples the two second ends in the second direction across the second part of the heat sink, and an arm of the U-shaped component couples one of the two first ends to a corresponding one of the two second ends.

3. The heat sink of claim 1, further comprising: a second transmission mechanism extending along the third direction and coupled to the first transmission mechanism; wherein the second transmission mechanism is adapted for causing the first transmission mechanism to apply a force having a component along the first direction on the second part, in response to a movement of the second transmission mechanism along the third direction.

4. The heat sink of claim 3, further comprising:
a first torsion spring rotatably coupled to the side wall via the shaft defined by the second direction;
wherein the second transmission mechanism comprises a first protrusion protruding in the second direction; and
wherein an end of the first torsion spring is coupled to the first protrusion and a further end of the first torsion spring is coupled to the first end of the first transmission mechanism.

5. The heat sink of claim 4, further comprising:
a second torsion spring rotatably coupled to a bottom of the plug-in card via a shaft defined by the first direction; and
a pressing part operable to receive a press operation along the second direction, the pressing part comprising a second protrusion protruding in the second direction;
wherein the second transmission mechanism further comprises a recess oriented in the first direction; and
wherein an end of the second torsion spring is coupled to the second protrusion, and a further end of the second torsion spring is coupled to the recess of the second transmission mechanism.

6. A device, comprising:
a plug-in card defining a surface; and
a heat sink coupled to the plug-in card, the heat sink including:
a first part secured to a surface of the plug-in card, the first part having a first heat radiating fin extending along a first direction, the first direction being perpendicular to the surface of the plug-in card;
a second part coupled to the first part and being movable relative to the first part in the first direction such that the heat sink has different heights with different overlaps between the first part and the second part, the second part having a second heat radiating fin corresponding to the first heat radiating fin and extending along the first direction; and a first transmission mechanism pivotably coupled to a side wall of the plug-in card via a shaft oriented along a second direction perpendicular to the first direction, wherein the side wall extends along a third direction perpendicular to the first direction and the second direction, the first transmission mechanism comprising a first end coupled to the shaft and a second end coupled to the second part of the heat sink, wherein one of:
the first heat radiating fin and the second heat radiating fin are arranged in a staggered manner in the first direction and are in thermal contact with each other, and have an offset in between in a second direction perpendicular to the first direction; or the first heat radiating fin and the second heat radiating fin are aligned with each other in the first direction, and at least a portion of the second heat radiating fin is receivable in the first heat radiating fin and is in thermal contact with the first heat radiating fin.

7. The device of claim 6, wherein the first transmission mechanism is configured as a U-shaped component comprising two first ends and two second ends; and wherein a bottom part of the U-shaped component couples the two second ends in the second direction across the second part of the heat sink, and an arm of the U-shaped component couples one of the two first ends to a corresponding one of the two second ends.

8. The device of claim 6, further comprising: a second transmission mechanism extending along the third direction and coupled to the first transmission mechanism; wherein the second transmission mechanism is adapted for causing the first transmission mechanism to apply a force having a component along the first direction on the second part, in response to a movement of the second transmission mechanism along the third direction.

9. The device of claim 8, further comprising:
a first torsion spring rotatably coupled to the side wall via the shaft defined by the second direction;
wherein the second transmission mechanism comprises a first protrusion protruding in the second direction; and
wherein an end of the first torsion spring is coupled to the first protrusion and a further end of the first torsion spring is coupled to the first end of the first transmission mechanism.

10. The device of claim 9, further comprising:
a second torsion spring rotatably coupled to a bottom of the plug-in card via a shaft defined by the first direction; and
a pressing part operable to receive a press operation along the second direction, the pressing part comprising a second protrusion protruding in the second direction;
wherein the second transmission mechanism further comprises a recess oriented in the first direction; and
wherein an end of the second torsion spring is coupled to the second protrusion, and a further end of the second torsion spring is coupled to the recess of the second transmission mechanism.

11. A method, comprising:
attaching a heat sink to a plug-in card by securing a first part of the heat sink to a surface of the plug-in card;
coupling a second part of the heat sink to the first part such that the second part is movable relative to the first part in a first direction, the first direction is perpendicular to the surface of the plug-in card, the first part having a first heat radiating fin extending along the first direction, and the second part having a second heat radiating fin corresponding to the first heat radiating fin and extending along the first direction, the first and second heat radiating fins being in thermal contact with each other;

arranging one of:
- the first heat radiating fin and the second heat radiating fin in a staggered manner in the first direction while defining an offset therebetween in a second direction perpendicular to the first direction; or
- arranging the first heat radiating fin and the second heat radiating fin to be aligned with each other in the first direction, wherein at least a portion of the second heat radiating fin is receivable in the first heat radiating fin;

pivotably coupling a first transmission mechanism to a side wall of the plug-in card via a shaft oriented along the second direction, wherein the side wall extends along a third direction perpendicular to the first direction and a second direction; and coupling a first end of the first transmission mechanism to the shaft and a second end of the first transmission mechanism to the second part of the heat sink; and causing movement of the first part in the first direction such that the heat sink has different heights with different overlaps between the first part and the second part.

12. The method of claim 11, wherein the first transmission mechanism is configured as a U-shaped component comprising two first ends and two second ends, the method including: coupling a bottom part of the U-shaped component such that the two second ends extend in the second direction across the second part of the heat sink; and coupling an arm of the U-shaped component to one of the two first ends and to a corresponding one of the two second ends.

13. The method of claim 11, further comprising: coupling a second transmission mechanism to the first transmission mechanism such that the second transmission mechanism extends along the third direction; and causing, with the second transmission mechanism, the first transmission mechanism to apply a force having a component along the first direction on the second part, in response to a movement of the second transmission mechanism along the third direction.

14. The method of claim 13, further comprising:
rotatably coupling a first torsion spring to the side wall, the rotatably coupling including:
coupling an end of the first torsion spring to a first protrusion of the second transmission mechanism, wherein the first protrusion protrudes in the second direction; and
coupling a further end of the first torsion spring to the first end of the first transmission mechanism.

* * * * *